US012133345B2

(12) United States Patent
Zhao et al.

(10) Patent No.: US 12,133,345 B2
(45) Date of Patent: Oct. 29, 2024

(54) ELECTRONIC DEVICE

(71) Applicant: VIVO MOBILE COMMUNICATION CO., LTD., Guangdong (CN)

(72) Inventors: Feifei Zhao, Guangdong (CN); Rongfei Su, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 369 days.

(21) Appl. No.: 17/573,515

(22) Filed: Jan. 11, 2022

(65) Prior Publication Data

US 2022/0132691 A1   Apr. 28, 2022

Related U.S. Application Data

(63) Continuation of application No. PCT/CN2020/100431, filed on Jul. 6, 2020.

(30) Foreign Application Priority Data

Jul. 17, 2019 (CN) .......................... 201910645582.1

(51) Int. Cl.
*G06F 1/16* (2006.01)
*G04G 17/04* (2006.01)
(Continued)

(52) U.S. Cl.
CPC ......... *H05K 5/0226* (2013.01); *G04G 17/045* (2013.01); *G06F 1/163* (2013.01);
(Continued)

(58) Field of Classification Search
None
See application file for complete search history.

(56) References Cited

U.S. PATENT DOCUMENTS 8,082,631 B2 * 12/2011 Eromaki ............... G06F 1/1616
16/370
11,567,532 B2 * 1/2023 Jung ..................... G06F 3/0481
(Continued)

FOREIGN PATENT DOCUMENTS

CN          201569827 U      9/2010
CN          102150126 A      8/2011
(Continued)

OTHER PUBLICATIONS

The First Office Action of Priority Application No. CN 201910645582.1 issued by the Chinese Patent Office on Oct. 22, 2020.
(Continued)

*Primary Examiner* — Anthony Q Edwards
*Assistant Examiner* — Rashen E Morrison
(74) *Attorney, Agent, or Firm* — IP & T GROUP LLP

(57) ABSTRACT

An electronic device includes: a first display, a transmission assembly, and at least two second displays. The first display includes a first surface and a second surface opposite to the first surface. The at least two second displays are connected to the transmission assembly. The transmission assembly drives the at least two second displays to move between first positions and second positions. When the at least two second displays are located at the first positions, at least part of each of the least two second displays is covered by a orthographic projection of the first display along a perpendicular direction of the second surface. When the at least two second displays are located at the second positions, at least two second displays are located on an periphery of the first display and abut against an outer peripheral wall of the first display.

17 Claims, 4 Drawing Sheets

(51) Int. Cl.
*H05K 5/00* (2006.01)
*H05K 5/02* (2006.01)

(52) U.S. Cl.
CPC ......... *G06F 1/1647* (2013.01); *H05K 5/0017* (2013.01); *H05K 5/0021* (2013.01)

(56) References Cited

U.S. PATENT DOCUMENTS

| | | | |
|---|---|---|---|
| 2005/0164750 A1 | 7/2005 | Cheng | |
| 2009/0015514 A1 | 1/2009 | Suzuki et al. | |
| 2009/0104931 A1* | 4/2009 | Chiang | H04M 1/0254 455/556.1 |
| 2010/0064244 A1* | 3/2010 | Kilpatrick, II | H04M 1/0243 345/1.3 |
| 2010/0066643 A1 | 3/2010 | King et al. | |
| 2016/0037672 A1* | 2/2016 | Zhang | H05K 7/1461 361/679.01 |
| 2016/0170379 A1* | 6/2016 | Zhang | G04G 9/0029 368/239 |
| 2017/0261941 A1* | 9/2017 | Liu | G04G 9/0005 |
| 2020/0100383 A1* | 3/2020 | Hershey | H05K 9/0062 |

FOREIGN PATENT DOCUMENTS

| | | |
|---|---|---|
| CN | 102540850 A | 7/2012 |
| CN | 103064464 A | 4/2013 |
| CN | 103716428 A | 4/2014 |
| CN | 204129444 U | 1/2015 |
| CN | 104483825 A | 4/2015 |
| CN | 205451034 A | 8/2016 |
| CN | 205608604 U | 9/2016 |
| CN | 205845042 U | 12/2016 |
| CN | 106371509 A | 2/2017 |
| CN | 106990706 A | 7/2017 |
| CN | 108535994 A | 9/2018 |
| CN | 207817576 U | 9/2018 |
| CN | 109782576 A | 5/2019 |
| CN | 110426946 A | 11/2019 |
| EP | 1343058 A1 | 9/2003 |
| KR | 10-2010-0042149 A | 4/2010 |
| KR | 10-2017-0136907 A | 12/2017 |
| WO | 01/079956 A3 | 10/2001 |
| WO | 2006/103965 A1 | 10/2006 |
| WO | 2016203321 A2 | 12/2016 |
| WO | 2016203321 A3 | 12/2016 |

OTHER PUBLICATIONS

The Second Office Action of Priority Application No. CN 201910645582.1 issued by the Chinese Patent Office on May 10, 2021.

International Search Report and Written Opinion of International Application No. PCT/CN2020/100431 issued by the Chinese Patent Office on Oct. 10, 2020.

Extended European Search Report for European Patent Application No. 20841567.9 issued by the European Patent Office on Jul. 29, 2022.

* cited by examiner

A-A

ELECTRONIC DEVICE

CROSS-REFERENCE TO RELATED APPLICATIONS

This application is a Bypass Continuation Application of PCT/CN2020/100431 filed on Jul. 6, 2020, which claims priority to Chinese Patent Application No. 201910645582.1 filed on Jul. 17, 2019, which are incorporated herein by reference in their entirety.

TECHNICAL FIELD

The present disclosure relates to the field of communications technologies, and in particular, to an electronic device.

BACKGROUND

With rapid development of technologies, electronic devices such as a mobile phone, a tablet computer, and a wearable device have brought great convenience to people's work and life, and have become one of necessary electronic products in people's daily work and life. Most related electronic devices have displays of a single structure. Especially for a wearable device, a display has a small size, and it is inconvenient for a user to operate on or watch.

SUMMARY

Embodiments of the present disclosure provide an electronic device.

Some embodiments of the present disclosure provide an electronic device, including: a first display, a transmission assembly, and at least two second displays. The first display includes a first surface and a second surface opposite to the first surface, the at least two second displays are connected to the transmission assembly, and the transmission assembly drives the at least two second displays to move between first positions and second positions;

when the at least two second displays are located at the first positions, at least part of each of the least two second displays is covered by a orthographic projection of the first display along a perpendicular direction of the second surface; or when the at least two second displays are located at the second positions, the at least two second displays are located on a periphery of the first display, and abut against an outer peripheral wall of the first display.

DESCRIPTION OF DRAWINGS

To describe the technical solutions of the embodiments of the present disclosure more clearly, the following briefly describes the accompanying drawings required for describing the embodiments of the present disclosure. Apparently, the accompanying drawings in the following description show merely some embodiments of the present disclosure, and a person of ordinary skill in the art may still derive other drawings from these accompanying drawings.

DETAILED DESCRIPTION OF EMBODIMENTS

The following clearly describes the technical solutions in the embodiments of the present disclosure with reference to the accompanying drawings in the embodiments of the present disclosure. Apparently, the described embodiments are some rather than all of the embodiments of the present disclosure. All other embodiments obtained by a person of ordinary skill in the art based on the embodiments of the present disclosure shall fall within the protection scope of the present disclosure.

Figure 1:
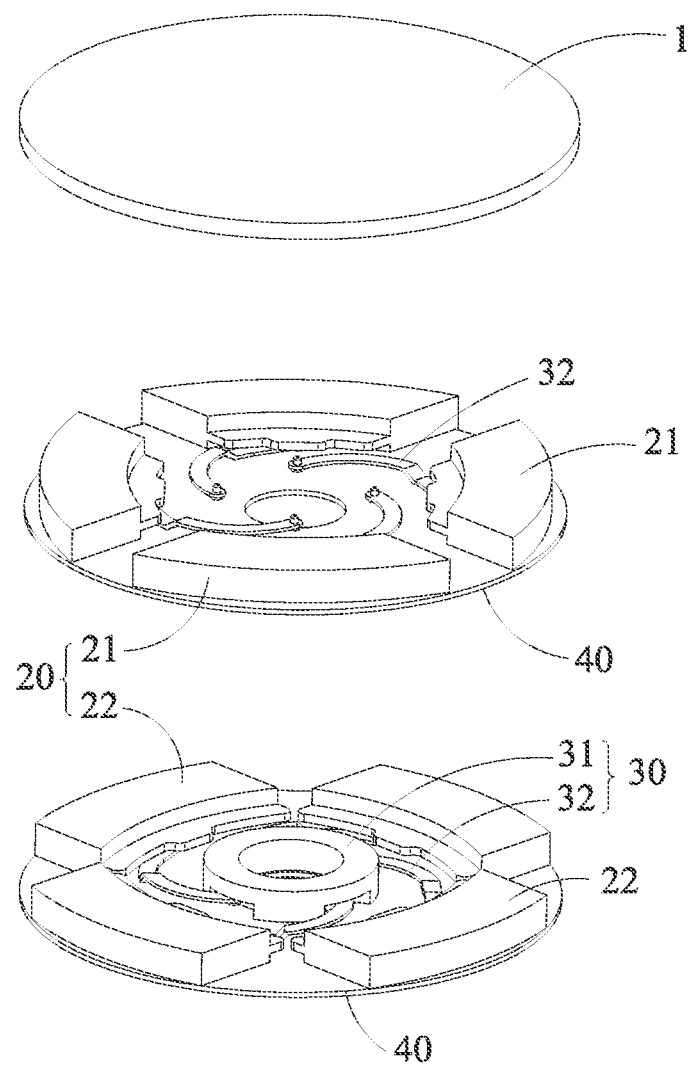
FIG. 1 is exploded view of an electronic device according to some embodiments of the present disclosure.
Figure 5:
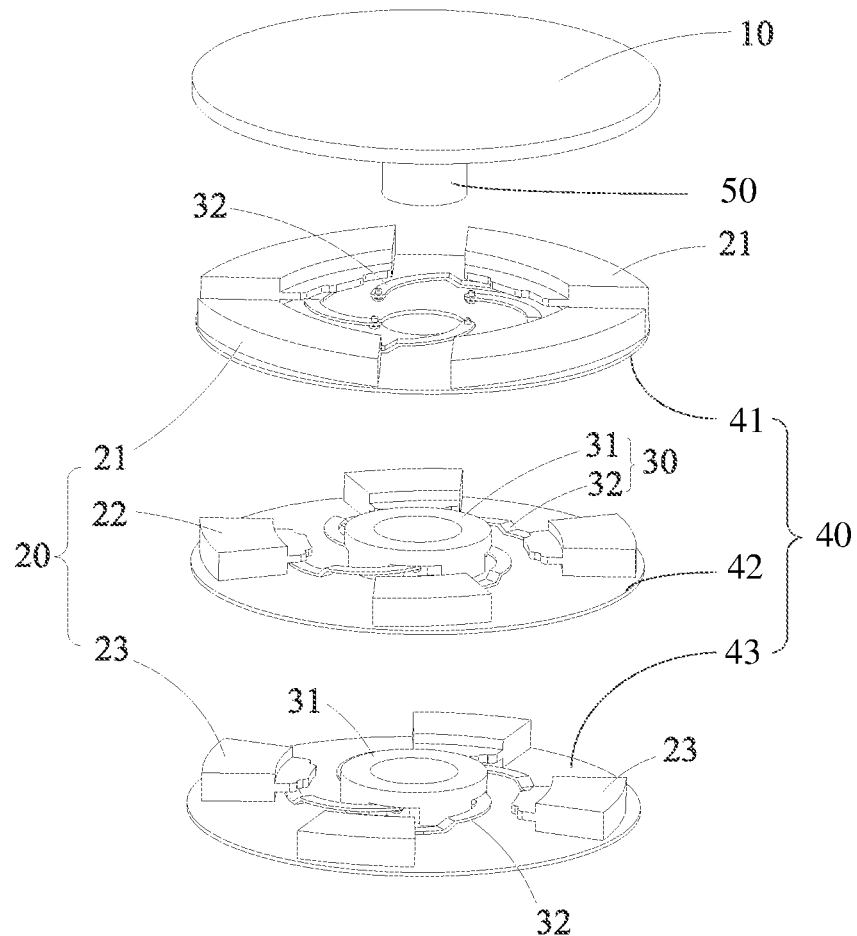
FIG. 5 is exploded view of an electronic device according to some embodiments of the present disclosure.

Some embodiments of the present disclosure provide an electronic device. Referring to FIG. 1 and FIG. 5, the electronic device includes a first display 10, a transmission assembly 30, and at least two second displays 20. The first display 10 includes a first surface (not shown) used to display an image and a second surface (not shown) opposite to the first surface. The at least two second displays 20 are connected to the transmission assembly 30, and the transmission assembly 30 drives the at least two second displays 20 to move between first positions and second positions. When the at least two second displays 20 are located at the first positions, at least part of each of the least two second displays 20 is covered by a projection of the first display 10 along a orthographic perpendicular direction of the second surface; or when the at least two second displays 20 are located at the second positions, at least two second displays 20 are located on a periphery of the first display 10, and abut against an outer peripheral wall of the first display 10.

In the technical solution provided in some embodiments of the present disclosure, the second displays 20 of the electronic device can move between the first positions and the second positions when driven by the transmission assembly 30, to improve flexibility of a display of the electronic device, and solve the problem in the prior art that a display of an electronic device has a single structure.

Figure 2:
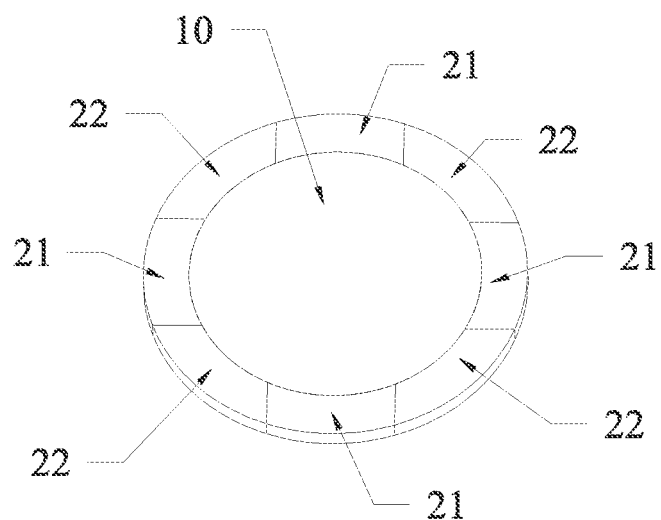
FIG. 2 is a schematic structural diagram of the electronic device in FIG. 1 when second displays are located at second positions.
Figure 6:
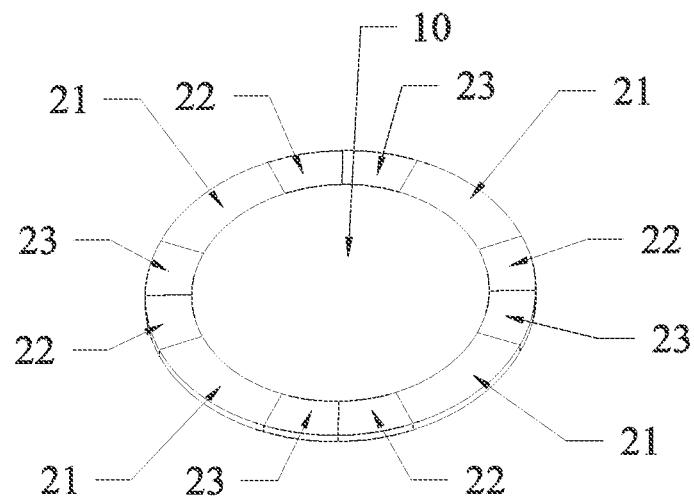
FIG. 6 is a schematic structural diagram of the electronic device in FIG. 5 when second displays are located at second positions.

Referring to FIG. 2 and FIG. 6, when the second displays 20 are located at the second positions, the second displays 20 enclose the first display 10 and abut against the outer peripheral wall of the first display 10. In this case, the second displays 20 and the first display 10 are stitched into a display having a relatively large displaying size, to increase a size of a display screen of the electronic device and facilitate watching of a user, so that the user has a better watching experience and it is convenient for the user to operate on the display.

In some embodiments of the present disclosure, referring to FIG. 1 and FIG. 5, the transmission assembly 30 faces the second surface, that is, is located on a side of the first display 10 that is not used to display an image.

Still referring to FIG. 1 and FIG. 5, when the second displays 20 are located at the first positions, the second displays 20 are located on a side close to the second surface of the first display 10. In this case, the electronic device displays an image through the first display 10. In an optional implementation, an area of each second display 20 is less than an area of the first display 10, and when the second displays 20 are located at the first positions, the first display 10 covers the at least two second displays 20 in the perpendicular direction of the second surface. In other words, the second displays 20 are hidden under the first display 10, and the second displays 20 are not exposed to the outside of the first display 10, to ensure beauty of an appearance of a small-sized electronic device, for example, a wearable device such as a smart watch, and facilitate wearing of a user.

In some embodiments of the present disclosure, the electronic device further includes a rotating shaft 50. The movement of the transmission assembly 30 may be driven by the rotating shaft 50.

Optionally, the rotating shaft 50 may be connected to the first display 10, and the transmission assembly 30 is rotatably connected to the first display 10 through the rotating shaft 50. For example, the rotating shaft 50 may be disposed on a center area of the second surface of the first display 10, and the rotating shaft 50 extends in a direction away from the second surface. The transmission assembly 30 may be sleeved on the rotating shaft 50, and rotation of the first display 10 drives the rotating shaft 50 and the transmission assembly 30 to rotate coaxially, so that the transmission assembly 30 drives the second displays 20 to move. A user may manually rotate the first display 10 to rotate the rotating shaft 50.

In another implementation, a drive motor may be further disposed on the electronic device. The transmission assembly 30 is connected to the drive motor. Running of the drive motor drives the transmission assembly 30 to rotate, so that the transmission assembly 30 drives the second displays 20 to move. The drive motor may be disposed inside a housing of the electronic device, and is electrically connected to a controller of the electronic device. The controller of the electronic device controls running of the drive motor, to drive the transmission assembly 30 to rotate. Alternatively, the rotating shaft 50 may be connected to the drive motor, and the drive motor runs to drive the rotating shaft 50 to move, to drive the transmission assembly 30 and the second display to move. Alternatively, both the transmission assembly and the rotating shaft 50 are connected to the drive motor, and the drive motor runs to drive both the rotating shaft 50 and the transmission assembly 30 to move. For a circuit connection relationship between the drive motor and the controller and working principles thereof, refer to the prior art, and details are not provided herein again.

Still referring FIG. 1 and FIG. 5, the transmission assembly 30 includes a transmission shaft 31 and transmission rods 32. The transmission shaft 31 is connected to the first display 10 through the rotating shaft 50 (as shown in FIG. 5), so that rotation of the first display 10 can drive the rotating shaft 50 and the transmission shaft 31 to rotate. Alternatively, in a case that the electronic device further includes the drive motor, the transmission shaft 31 and/or the rotating shaft 50 is connected to the drive motor, so that the transmission shaft 31 and/or the rotating shaft 50 is driven, by running of the motor, to move. One end of each of the transmission rods 32 is connected to the transmission shaft 31, and the other end is connected to the second display 20. In this way, rotation of the transmission shaft 31 can drive the transmission rods 32 to move, to push the second displays 20 connected to the ends of the transmission rods 32 outwards, to implement stitching of the second displays 20 and the first display 10, or pull the second displays 20 inwards to hide the second displays 20 under the first display 10.

Optionally, the transmission shaft 31 may be sleeved on the rotating shaft 50, one end of each of the transmission rods 32 is hinged with the transmission shaft 31, and the other end of the transmission rods 32 is hinged with the second display 20. In this way, when the rotating shaft 50 rotates forward, the transmission shaft 31 is driven to rotate coaxially, rotation of the transmission shaft 31 can exert thrust on the transmission rods 32 that are hinged with the transmission shaft 31, and the transmission rods 32 can push, outwards through the thrust, the second displays 20 that are hinged with the transmission rods 32. It is easily understood that when the rotating shaft 50 rotates reversely, the second displays 20 can be pulled inwards through co-working of the transmission shaft 31 and the transmission rods 32.

In some embodiments of the present disclosure, the electronic device may further include a tray 40. The tray 40 is used to support the second display 20. A first guiding structure 401 is disposed on a side of the tray 40 facing the first display 10, a second guiding structure 201 is disposed on the second display 20, and the first guiding structure 401 cooperates with the second guiding structure 201. When the at least two second displays 20 move to the second positions through the first guiding structures 401 and the second guiding structures 201, the at least two second displays 20 and the first display 10 are located on a same plane.

It should be noted that the first display 10 covers the tray 40. In other words, a size of the tray 40 is less than or equal to a size of the first display 10, so that the tray 40 is not exposed to the outside of the first display 10, and when the second displays 20 are located at the first positions, the second displays 20 and the tray 40 are covered by the first display 10, to ensure beauty of appearance of the electronic device. In addition, the rotating shaft 50 and the transmission shaft 31 may run through the tray 40, and the tray 40 is sleeved on the rotating shaft 50 or the transmission shaft 31; or when there is one tray 40, the tray 40 may be connected to a housing of the electronic device, and when the transmission shaft 31 rotates, the tray 40 is fixed.

Optionally, a quantity of the first guiding structures 401 is the same as a quantity of the second guiding structures 201. For example, if there are four second displays 20, one second guiding structure 201 is disposed on each second display 20, and one first guiding structure 401 cooperating with each second guiding structure 201 is disposed on the tray 40. In this way, the first guiding structures 401 and the second guiding structures 201 can guide movement of the second displays 20 and prevent displacement of movement of the second display 20, to guide the plurality of second displays 20 to move to the second positions to be on a same plane as the first display 10 and be stitched into an entire display screen together with the first display 10, for example, a round or square display screen.

Figure 3:
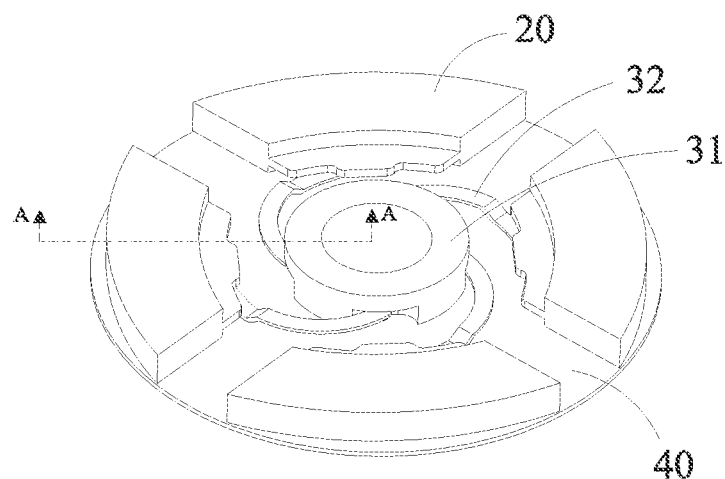
FIG. 3 is a schematic structural diagram of a position relationship between some second displays in FIG. 1 in a first position and a tray.

Optionally, there may be a plurality of structural forms of the first guiding structures 401 and the second guiding structures 201. For example, the first guiding structure 401 and the second guiding structure 201 may be configured to a slideway and a sliding slot, or may be configured to another form. For example, the rotating shaft 50 is disposed on the second surface of the first display 10, the transmission shaft 31 is sleeved on the rotating shaft 50, and the transmission rods 32 are connected to the transmission shaft 31 and the second displays 20. Optionally, the first guiding structure 401 is a slideway, the second guiding structure 201 is a sliding slot, the slideway and the sliding slot extend in a direction pointing to a center of circle of the transmission shaft 31, and the slideway and the sliding slot limit a moving direction of the second display. As shown in FIG. 3, the transmission bar 32 is an arc-shaped bar, and two ends of the transmission bar 32 are respectively hinged with the transmission shaft 31 and the second display 10. When the transmission shaft 31 rotates, the transmission bar 32 pushes, under thrust, the second display 20 to move. Due to the slideway and the sliding slot, the second display 20 can move only in an extension direction of the slideway and in a direction away from the transmission shaft 31, to move to the outer side of the first display 10.

Figure 4:
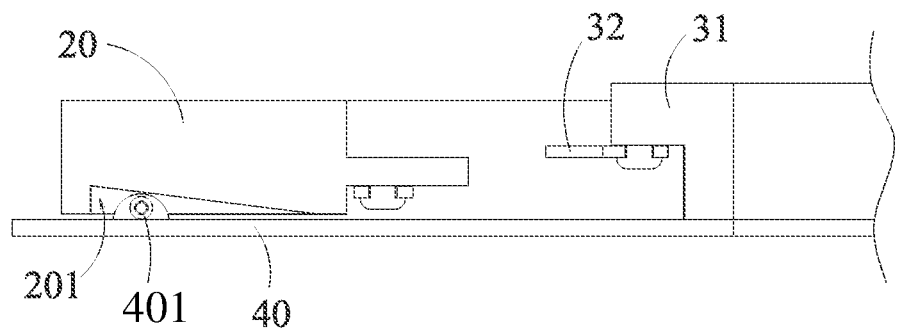
FIG. 4 is a sectional view of FIG. 3 from an A-A angle of view.

In an optional implementation, referring to FIG. 4, the first guiding structure 401 is a sliding part, and is optionally a roller, and the second guiding structure 201 is a guiding slot. The guiding slot includes a first side wall and a bottom surface, the bottom surface is an oblique surface, and a distance between a part of the bottom surface close to the transmission assembly 30 and the tray 40 is less than a distance between a part of the bottom surface away from the transmission assembly 30 and the tray 40. In other words, the bottom surface of the guiding slot is an oblique surface relative to the tray 40, the bottom surface of the guiding grove includes a first end close to the transmission shaft 31 and a second end away from the transmission shaft 31, and the first end is closer to the tray 40 than the second end. The guiding slot is located on a side of the second display 20 facing the tray 40, and the roller is disposed on the tray 40, and contacts the bottom surface of the guiding slot. The tray 40 is fixed, and a position of the roller on the tray 40 is not changed. Therefore, when the second display 20 move from the first position to the second position, the guiding slot moves relative to the roller, and rolling of the roller exerts thrust on the guiding slot, to push the second display 20 to move towards the second position. In addition, a depth of an end of the bottom surface of the guiding slot close to the transmission shaft 31 is less than a depth of an end away from the transmission shaft 31. When the second display 20 moves to the second position, because the bottom surface of the guiding slot is an oblique surface and the position of the roller is not changed, the second display 20 may move in a direction away from the transmission shaft 31 under thrust of the transmission bar 32, and the roller and the guiding slot can enable the second display 20 to move in a direction away from the tray 40, so that the second displays 20 can move to a same plane as the first display 10, and when the second displays 20 are located at the second positions, the second displays 20 and the first display 10 are stitched into an entire plane, to ensure smoothness of the display screen of the electronic device, and ensure a display effect of the electronic device.

In some embodiments of the present disclosure, a quantity of the trays 40 is not limited. For example, there may be one tray or at least two trays. When there are at least two trays 40, the trays 40 are stacked relative to the first display 10, in other words, the trays 40 are stacked in a perpendicular direction of the first display 10.

Referring to FIG. 1 and FIG. 2, in the electronic device provided in an embodiment of the present disclosure, there are two trays 40. The two trays 40 are stacked relative to the first display 10 and are located below the first display 10. The first display 10 can cover the two trays 40. For example, the two trays 40 are respectively a first tray and a second tray. The first tray and the second tray carry the second displays 20. The first tray carries a first sub display 21, the second tray carries a second sub display 22, and there is at least one first sub display 21 and at least one second sub display 22. In this way, the two trays 40 are disposed, so that the second displays 20 are disposed in a layered manner, and sizes of the second displays 20 can be designed to be relatively small.

In addition, when there are at least two first sub displays 21 and at least two second sub displays 22, the first sub displays 21 and the second sub displays 22 are disposed alternately when being located at the second positions.

Still referring to FIG. 1 and FIG. 2, there are four first sub displays 21 and four second sub displays 22. As shown in FIG. 2, the four first sub displays 21 and the four second sub displays 22 are disposed alternately when being located at the second positions. In this way, a size of each first sub display 21 and a size of each second sub display 22 are relatively small, and when the second displays are located at the first positions, it can be avoided that two adjacent second displays 20 on a same tray 40 contact each other, thereby ensuring smoothness of movement of the second displays 20 between the first positions and the second positions.

Certainly, there may be three trays 40, four trays 40, or more trays 40, and each tray 40 carries a second display 20. When the plurality of second displays 20 are located at the second positions, the second displays are stitched into a ring and enclose the first display 10. A larger quantity of second displays 20 indicates that sizes of the second displays can be designed to be smaller, facilitating arrangement of the second displays 20 in the electronic device.

Figure 7:
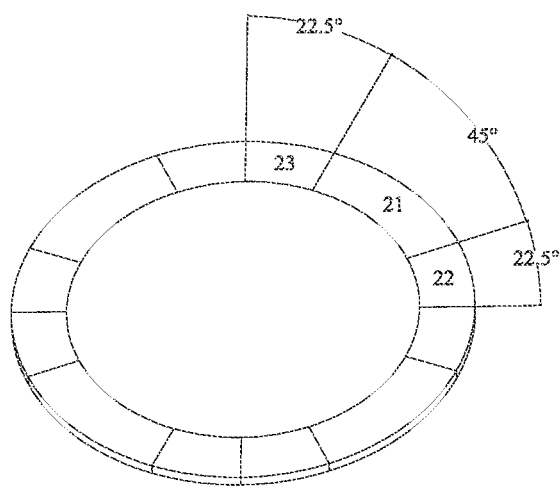
FIG. 7 is a schematic diagram of angles of the second displays in FIG. 6.

Referring to FIG. 5 and FIG. 7, in the electronic device provided in some embodiments of the present disclosure, there are three trays 40. The three trays 40 are stacked relative to the first display 10 and are located below the first display 10. The first display 10 can cover the three trays 40, to ensure beauty of appearance of the electronic device. Optionally, the three trays 40 may be respectively a first tray 41, a second tray 42, and a third tray 43, and the at least two second displays 20 include at least two first sub displays 21 supported by the first tray 41, at least two second sub displays 22 supported by the second tray 42, and at least two third sub displays 23 supported by the third tray 43.

Optionally, referring to FIG. 5 and FIG. 6, there are four first sub displays 21, four second sub displays 22, and four third sub displays 23. When the four first sub displays 21, the four second sub displays 22, and the four third sub displays 23 are located at the second positions, one second sub display 22 and one third sub display 23 are located between any two adjacent first sub displays 21, and one third sub display 23 and one first sub display 21 are located between any two adjacent second sub displays 22. In this way, the 12 second displays 20 are stitched into a ring and enclose the first display 10 when being located at the second positions, to form a larger display together with the first display 10, so that the electronic device has a larger display screen. The four first sub displays 21, the four second sub displays 22, and the four third sub displays 23 are stitched in a sequence shown in FIG. 6 to form an entire ring and enclose the first display 10 when being located at the second positions.

Optionally, referring to FIG. 7, a central angle corresponding to a display area of the first sub display 21 is 45 degrees, a central angle corresponding to a display area of the second sub display 22 is 22.5 degrees, and a central angle corresponding to a display area of the third sub display 23 is 22.5 degrees. In this way, sizes of the second sub displays 22 disposed on the second tray 42 and sizes of the third sub displays 23 disposed on the third tray 43 can be designed to be smaller, facilitating arrangement of the second displays 20 in the electronic device.

It should be noted that in the embodiments of FIG. 5 to FIG. 7, the transmission assembly 30, the first guiding structures, and the second guiding structures may be designed in a manner in the embodiments of FIG. 1 to FIG. 4, and details are not provided herein again.

In some embodiments of the present disclosure, the electronic device may be a smartphone, a tablet computer, an e-book reader, an MP3 player, an MP4 player, a wearable device, or the like. Optionally, the electronic device is a wearable device such as a smart watch. In this design, a size of a display of the smart watch can be adjusted based on an operation of the user, to adjust the display to be a larger display when needed by the user, to facilitate the user in operating on and watching the smart watch.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. An electronic device, comprising: a first display, a transmission assembly, and at least two second displays, wherein the first display comprises a first surface and a second surface opposite to the first surface, the at least two second displays are connected to the transmission assembly, and the transmission assembly drives the at least two second displays to move between first positions and second positions, wherein when the at least two second displays are located at the first positions, at least part of each of the least two second displays is covered by a orthographic projection of the first display along a perpendicular direction of the second surface; or when the at least two second displays are located at the second positions, the at least two second displays are located on a periphery of the first display, and abut against an outer peripheral wall of the first display; and the electronic device further comprises a rotating shaft, wherein the transmission assembly is connected to the rotating shaft, and the rotating shaft is connected to the first display; wherein the rotating shaft is disposed in a center area of the second surface, and extends in a direction away from the second surface.

2. The electronic device according to claim 1, wherein the transmission assembly is rotatably connected to the first display through the rotating shaft.

3. The electronic device according to claim 1, further comprising a drive motor, wherein the transmission assembly and/or the rotating shaft is connected to a drive motor.

4. The electronic device according to claim 1, wherein the transmission assembly comprises a transmission shaft and transmission rods, and the transmission shaft is connected to the first display through the rotating shaft, or in a case that the electronic device further comprises a drive motor, the transmission shaft and/or the rotating shaft is connected to the drive motor, one end of each of the transmission rods is connected to the rotating shaft, and another end of each of the transmission rods is connected to a second display.

5. The electronic device according to claim 4, wherein the transmission shaft is sleeved on the rotating shaft, one end of each of the transmission rods is hinged with the transmission shaft, and another end of the transmission rods is hinged with the second display.

6. The electronic device according to claim 1, further comprising a tray, wherein the tray supports a second display, a first guiding structure is disposed on a side of the tray facing the first display, a second guiding structure is disposed on the second display, and the first guiding structure cooperates with the second guiding structure; and when the at least two second displays move to the second positions through the first guiding structures and the second guiding structures, the at least two second displays and the first display are located on a same plane.

7. The electronic device according to claim 6, wherein the first guiding structure is a sliding part, the second guiding structure is a guiding slot, the guiding slot comprises a first side wall and a bottom surface, the bottom surface is an oblique surface, and a distance between a part of the bottom surface close to the transmission assembly and the tray is less than a distance between a part of the bottom surface away from the transmission assembly and the tray.

8. The electronic device according to claim 6, wherein there are at least two trays, and the at least two trays are stacked in the perpendicular direction of the second face.

9. The electronic device according to claim 8, wherein the quantity of the trays is a same as the quantity of the second displays.

10. The electronic device according to claim 8, wherein there are two trays, and the at least two second displays comprise at least one first sub display supported by one tray and at least one second sub display supported by another tray.

11. The electronic device according to claim 10, wherein there are at least two first sub displays, there are at least two second sub displays, and the first sub displays and the second sub displays are disposed alternately when being located at the second positions.

12. The electronic device according to claim 11, wherein there are four first sub displays and four second sub displays, and the four first sub displays and the four second sub displays are disposed alternately when being located at the second positions.

13. The electronic device according to claim 9, wherein there are three trays, the three trays comprise a first tray, a second tray, and a third tray, and the at least two second displays comprise at least one first sub display supported by the first tray, at least one second sub display supported by the second tray, and at least one third sub display supported by the third tray.

14. The electronic device according to claim 13, wherein there are four first sub displays, four second sub displays, and four third sub displays, and when the four first sub displays, the four second sub displays, and the four third sub displays are located at the second positions, one second sub display and one third sub display are located between any two adjacent first sub displays, and one third sub display and one first sub display are located between any two adjacent second sub displays.

15. The electronic device according to claim 14, wherein a central angle corresponding to a display area of the first sub display is 45 degrees, a central angle corresponding to a display area of the second sub display is 22.5 degrees, and a central angle corresponding to a display area of the third sub display is 22.5 degrees.

16. The electronic device according to claim 1, wherein an area of each of the at least two second displays is less than an area of the first display, and when the at least two second displays are located at the first positions, the first display covers the at least two second displays in the perpendicular direction of the second surface.

17. The electronic device according to claim 1, wherein the transmission assembly faces the second surface.

\* \* \* \* \*